(12) United States Patent
Behrends et al.

(10) Patent No.: US 10,436,821 B2
(45) Date of Patent: Oct. 8, 2019

(54) APPARATUS FOR DETECTING AC COMPONENTS IN A DC CIRCUIT AND USE OF THE APPARATUS

(71) Applicant: SMA Solar Technology AG, Niestetal (DE)

(72) Inventors: Holger Behrends, Kassel (DE); Marcel Kratochvil, Kassel (DE); Gary Orbita, Kassel (DE)

(73) Assignee: SMA Solar Technology AG, Niestetal (DE)

( * ) Notice: Subject to any disclaimer, the term of this patent is extended or adjusted under 35 U.S.C. 154(b) by 877 days.

(21) Appl. No.: 15/007,812

(22) Filed: Jan. 27, 2016

(65) Prior Publication Data

US 2016/0146857 A1 May 26, 2016

Related U.S. Application Data

(63) Continuation of application No. PCT/EP2014/065787, filed on Jul. 23, 2014.

(30) Foreign Application Priority Data

Jul. 30, 2013 (DE) .................. 10 2013 108 166

(51) Int. Cl.
*G01R 15/18* (2006.01)
*G01R 19/00* (2006.01)
*H02S 50/10* (2014.01)

(52) U.S. Cl.
CPC .......... *G01R 15/18* (2013.01); *G01R 15/183* (2013.01); *G01R 19/0015* (2013.01); *G01R 19/0092* (2013.01); *H02S 50/10* (2014.12)

(58) Field of Classification Search
CPC ........ G01R 15/183; G01R 15/18; H02S 50/10
See application file for complete search history.

(56) References Cited

U.S. PATENT DOCUMENTS

| 4,814,696 A * | 3/1989 | Kern ....................... G01R 19/06 |
| | | 324/141 |
| 5,272,421 A * | 12/1993 | Kimura .................... H04N 9/28 |
| | | 315/367 |

(Continued)

FOREIGN PATENT DOCUMENTS

| DE | 2430294 A1 | 1/1976 |
| DE | 3139598 A1 | 6/1983 |

(Continued)

*Primary Examiner* — Patrick Assouad
*Assistant Examiner* — Haidong Zhang
(74) *Attorney, Agent, or Firm* — Eschweiler & Potashnik, LLC

(57) ABSTRACT

A device for detecting alternating-current components $i_{AC}$ of an electric current $i_{ACDC}$ flowing in a direct-current circuit includes an inductor arranged in the direct-current circuit, and an AC path arranged electrically in parallel with the inductor, wherein the AC path comprises a series circuit made up of a capacitor and a primary winding of a transformer. The device further includes a voltage measuring device, wherein a secondary winding of the transformer is connected to the voltage measuring device via a low-pass filter circuit.

12 Claims, 5 Drawing Sheets

(56) References Cited

U.S. PATENT DOCUMENTS

| | | | | |
|---|---|---|---|---|
| 5,590,012 A | * | 12/1996 | Dollar, II | ............. H02H 1/0015 |
| | | | | 324/536 |
| 2010/0033156 A1 | * | 2/2010 | Abe | ........................ H02J 5/005 |
| | | | | 323/305 |
| 2011/0141644 A1 | | 6/2011 | Hastings et al. | |
| 2014/0063662 A1 | * | 3/2014 | Scott | ...................... G08B 13/22 |
| | | | | 361/42 |

FOREIGN PATENT DOCUMENTS

| | | |
|---|---|---|
| JP | H09219754 A | 8/1997 |
| JP | 2001313729 A | 11/2001 |
| WO | 95/25374 | 9/1995 |
| WO | 96/30988 | 10/1996 |

* cited by examiner

APPARATUS FOR DETECTING AC COMPONENTS IN A DC CIRCUIT AND USE OF THE APPARATUS

CROSS REFERENCE TO RELATED APPLICATIONS

This application claims priority to International Patent Application number PCT/EP2014/065787, filed on Jul. 23, 2014, which claims priority to German Patent Application number 10 2013 108 166.5, filed on Jul. 30, 2013, and is hereby incorporated in its entirety.

FIELD

The disclosure relates to a device for detecting alternating-current components (AC components) of an electric current flowing in a direct-current circuit (DC circuit), in particular for detecting arc signals and/or communication signals in electric circuits which are provided for the transport of direct current (DC) having high DC current strengths. Furthermore, the present disclosure relates to the use of the device within a photovoltaic system.

BACKGROUND

Conventional current sensors for detecting AC components in a DC circuit operate on the principle of detecting an AC voltage induced in an inductive component via a time-varying field generated by the AC component, wherein the induced AC voltage corresponds to the AC component to be measured, in particular is proportional to it. So-called current converters are, in particular, used as inductive components, which are made up of coils having a magnetic core material and which achieve high inductance values while at the same time having a compact design and a low number of turns.

In particular in DC circuits of photovoltaic systems, DC current strengths in the order of several amperes up to several dozen amperes frequently occur. At the same time, the amplitudes of AC components which, for example, are generated by arcs to be detected in the DC circuit in the frequency range of several kHz up to several hundred kHz, are only a few milliamperes.

When using current sensors having a magnetic core material, a saturation of the core material must be avoided, in particular in the case of such high DC current strengths. For this purpose, either a core material having a low permeability is used or the volume of the core is increased. However, a lower permeability has a negative effect on the sensitivity and linearity of the sensor, which becomes noticeable in particular when measuring very small AC currents across a wide frequency range. A larger core volume in turn has a negative effect on the size and thus the costs.

Alternatively, current sensors are known which are configured as an air coil without a magnetic core and which are arranged toroidally around a conductor in which the AC component is to be measured. Due to the lack of core material, they are free of saturation effects and are thus well suited for the measurement of AC components on high DC currents. Such so-called Rogowski sensors are in particular suited for the measurement of AC components having large amplitudes or for the measurement of small AC components at high frequencies. However, they are only somewhat suitable for the measurement of small AC components at low frequencies.

The sensitivity of inductive current sensors is frequency-dependent, so that the lower the frequency of the AC component to be measured is, the higher the provided inductance must be. The inductance may be increased via an increase in the permeability of the core material or via a greater number of turns, thus resulting in increased size and costs.

SUMMARY

The present disclosure is directed to a device which makes it possible to detect alternating-current components (AC components) of an electric current flowing in a direct-current circuit (DC circuit) in a predefined frequency range with high sensitivity and accuracy, while being able to manufacture the device economically.

A device is disclosed for detecting alternating-current components (AC components) of an electric current flowing in a direct-current circuit (DC circuit) which includes an inductor arranged in the DC circuit, wherein an AC path is arranged electrically in parallel with the inductor and comprises a series circuit made up of a capacitor and a primary winding of a transformer. Furthermore, the device comprises a voltage measuring device. The device is characterized by a low-pass filter circuit, wherein a secondary winding of the transformer is connected to the voltage measuring device via the low-pass filter circuit, i.e., the secondary winding of the transformer is connected to an input and the voltage measuring device is connected to an output of the low-pass filter circuit.

The device is thus made up electrically of two paths, an AC path and a DC path, which separate the electric current flowing in the DC circuit into an AC component and a DC component, and a downstream linearization of the AC component by means of the low-pass filter circuit. The DC path comprises an inductor which is conductive for the DC component, but which constitutes a frequency-dependent resistor for the AC component and impedes it accordingly in that the impedance of the DC path increases linearly with increasing frequency. On the other hand, the AC path is blocked for the DC component due to the capacitor arranged in it. As a result, in one embodiment AC components of the current are routed via the AC path.

The advantage of this circuit is that the components arranged in the AC path do not have to be designed for the high DC current flowing in the DC path; therefore, it is not necessary to consider saturation effects in particular in the design of the transformer, and components in the AC path must merely exhibit a low current-carrying capacity. At a DC current strength of, for example, several tens of amperes in the DC path, a transformer may be used in the AC path according to the disclosure which is orders of magnitude smaller than if it were situated in the DC path in a conventional manner. Only the coil arranged in the DC path must be designed in such a manner that it does not saturate at the DC current strengths which occur.

In one specific embodiment, a high-pass filter formed by the inductor in the DC path and the capacitor in the AC path has a cutoff frequency which lies above frequencies of the AC components to be detected. At first glance, this design is disadvantageous for the detection of the AC components to be detected, since the transfer characteristic of the high-pass filter below the cutoff frequency has a profile which increases with increasing frequency, i.e., a nonlinear profile. However, on the one hand, the advantage results that the higher the cutoff frequency is selected, the smaller the inductors and capacitors are which may be used.

On the other hand, the low-pass filter circuit connected to the secondary winding of the transformer effectuates a linearization of the transfer characteristic. For this purpose, the low-pass filter circuit is designed in such a way that a transfer function of the low-pass filter circuit in a predefined frequency range, within which the AC components to be detected lie, has a profile which is complementary to the profile of the transfer function of the high-pass filter in the predefined frequency range. Specifically, this means that the transfer function of the low-pass filter circuit in a predefined frequency range has a slope which is comparable to that of the transfer function of the high-pass filter in the predefined frequency range, but has an opposite sign. Overall, the device thus has an approximately constant overall transfer function in the predefined frequency range, but at least an overall transfer function having a variation which is reduced with respect to the transfer function of the high-pass filter, i.e., the slope and/or the fluctuation range of the transfer factor is/are reduced. Specifically, in an implemented application case, the profile of the overall transfer function in the predefined frequency range may have a variation which is reduced at least by a factor of 5 with respect to the transfer function of the high-pass filter.

In doing so, the predefined frequency range comprises the AC components to be detected and lies below the cutoff frequency of the high-pass filter made up by the inductor in the DC path and the capacitor in the AC path. If a factor greater than two exists between the cutoff frequency (for example, several hundred kilohertz) and a lower limit of the predefined frequency range of the AC components to be detected (for example, a few tens of kilohertz), then the advantages obtained due to the miniaturization of the inductors outweigh the disadvantages which result due to the increased component complexity for the subsequent linearization via the low-pass filter circuit. In one embodiment the cutoff frequency of the high-pass filter is above a lower limit of the predefined frequency range at least by a factor of 5, for example, by a factor of 10, and is therefore above the predefined frequency range of the AC components to be detected.

In an embodiment of the disclosure, the transformer includes a termination resistor which in one embodiment is arranged electrically in parallel with the secondary winding of the transformer. In one embodiment the termination resistor may be designed in such a way that a resonance step-up of the transfer function of the high-pass filter at its cutoff frequency is attenuated or flattened in such a way that a transfer function results having a monotonically increasing profile in particular in the range of the cutoff frequency of the high-pass filter. Alternatively, the termination resistor may be increased in comparison to the aforementioned specific embodiment, so the primary winding of the transformer, along with the capacitor connected in series with it, form a bandpass filter having a pronounced resonance maximum below the cutoff frequency of the high-pass filter.

In a further embodiment of the disclosure, the DC path comprises a band-stop filter made up of a parallel circuit made up of the inductor and a capacitor, whereby the impedance of the DC path no longer increases only linearly with increasing frequency, but becomes very high in the frequency range of a resonance frequency of the band-stop filter determined by the design of the inductor and the capacitor. The AC components to be detected are then largely routed exclusively over the AC path, in particular in this frequency range. In one embodiment, the termination resistor of the transformer and the capacitor in the AC path are designed in such a way that the primary winding of the transformer, along with the capacitor connected in series with it, constitute a bandpass filter whose resonance frequency lies in the same frequency range as the resonance frequency of the band-stop filter. In other words, in one embodiment the minimum impedance of the AC path preferably coincides with the maximum impedance of the DC path, so that an optimum bandpass behavior is achieved. Frequency ranges in particular below the resonance frequency of the bandpass filter and/or the band-stop filter are then linearized via the low-pass filter circuit connected to the secondary winding of the transformer. In addition, the resonance step-up of the transfer function at the resonance frequency of the bandpass filter and/or the band-stop filter may be used for the optimal detection of additional, in particular narrowband, AC components such as powerline communication signals.

The low-pass filter circuit may be designed as a conventional passive low-pass filter or alternatively as an active low-pass filter, in particular as a one-stage or two-stage inverting or non-inverting integrator. Via amplification, in the case of the use of an active low-pass filter, for example, with the aid of operational amplifiers, in the frequency range of the AC components to be detected, it may be achieved that the attenuation of the AC components to be detected, which is caused by the combination made up of an inductor or band-stop filter and bandpass filter, is compensated for.

In one embodiment of the disclosure, the low-pass filter circuit is made up of a first-order integrator circuit which comprises an operational amplifier. In an alternative embodiment, the low-pass filter circuit is made up of a second-order integrator circuit which comprises a series connection of operational amplifiers.

In a further embodiment of the disclosure, a capacitor is arranged in parallel with the secondary winding of the transformer, which, together with a leakage inductance of the secondary winding of the transformer, forms a resonant circuit whose resonance frequency lies in the range of the lower limit of the frequency range of the AC components to be detected, but at least below the cutoff frequency of the high-pass filter or below the resonance frequency of the band-stop filter and/or the bandpass filter.

The alternating-current components detected by the voltage measuring device may be evaluated by an evaluation device, for example, a signal processor, with respect to predefinable characteristics. In particular, arcs which occur in the direct-current circuit when the direct current flowing in the direct-current circuit comprises high amplitudes in the range of several amperes, as may occur in particular in direct-current circuits of photovoltaic systems, generate characteristic AC components which may be detected by the voltage measuring device in a design of the device according to present disclosure and may be identified by the evaluation device as arc signals.

In addition, an alternating-current component may be impressed on the electric current flowing in the direct-current circuit for communications purposes. Such so-called powerline communication signals are also detected by the voltage measuring device and may be correspondingly evaluated by the evaluation device and passed to a powerline communication partner in particular by digital means.

In one embodiment of the disclosure, the evaluation device is configured to evaluate the AC components which are detected with the aid of the voltage measuring device, in a first predefined frequency range for the detection of arcs in the DC circuit, and in a second frequency range, which is different from the first frequency range, for the reception of powerline communication signals. In one embodiment the lower limit of the first predefined frequency range is below the resonance frequency of the band-stop filter and/or the bandpass filter at least by a factor of 5, for example, at least by a factor of 10, and is therefore in the frequency range which is transferred linerarly via the device. On the other hand, in one embodiment a center frequency of the powerline communication signals is above the first predefined frequency range; particularly preferably, the center frequency of the powerline communication signals corresponds to the resonance frequency of the band-stop filter and/or the bandpass filter. This is particularly advantageous for narrowband powerline communication signals, which are generally located in a higher frequency range above 100 kHz in order to achieve sufficient communication bandwidths.

The device is particularly suitable for use in a direct-current circuit of a photovoltaic system, since, on the one hand, in such a direct-current circuit, very high DC currents may flow having amplitudes of several amperes up to several tens of amperes, which impede the use of conventional current sensors. On the other hand, for example, in the case of damaged plug connections or inadequate conductor insulation in the direct-current circuit of a photovoltaic system, arcs may occur precisely because of the high DC currents, which must be detected for the purposes of hazard prevention. In addition, the direct-current circuits of a photovoltaic system are used in order to enable a data exchange between various components of the photovoltaic system with the aid of powerline communication, for example, between inverters and electronics such as circuit breakers or sensors which are in part remotely arranged on photovoltaic modules.

BRIEF DESCRIPTION OF THE DRAWINGS

The disclosure is explained and described in greater detail below based on various embodiments shown in the figures.

FIG. 1 shows an embodiment of a device according to the disclosure. An electric current $i_{ACDC}(t)$ flows in a direct-current circuit 1. The direct-current circuit 1 comprises a DC path 2 in which an inductor 9 is arranged. An AC path 3 is arranged electrically in parallel with the DC path 2, in which a series circuit made up of a capacitor 4 and a primary winding 5' of a transformer 6 is arranged. A termination resistor 10 is arranged electrically in parallel with a secondary winding 5" of the transformer 6. The termination resistor 10 may be transferred to the primary side via division by the square of the conversion ratio of the transformer 6. As a result, the series circuit made up of the capacitor 4 and the primary winding 5' constitutes a bandpass filter 13.

Figure 1:
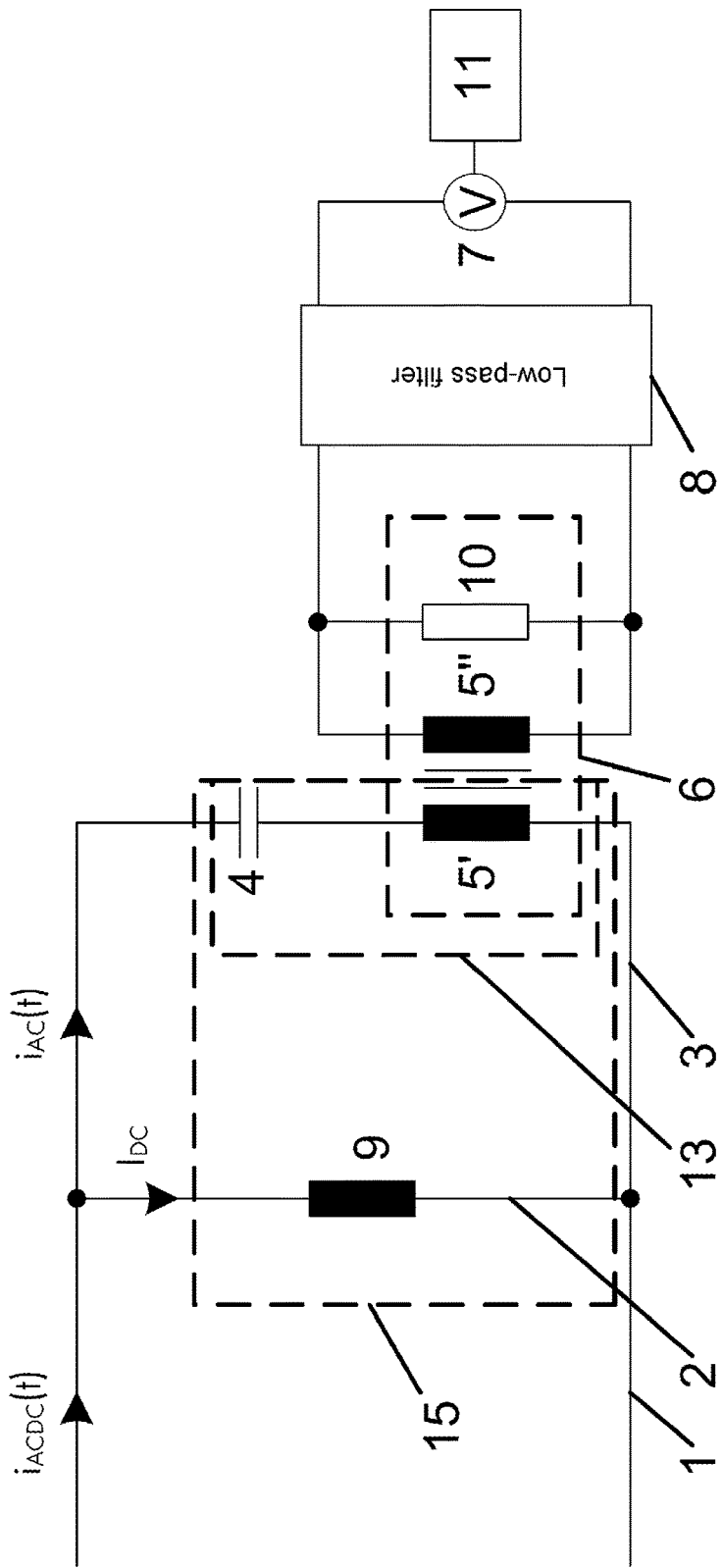
FIG. 1 shows an embodiment of a device according to the disclosure.

Due to the frequency-dependent impedances of the capacitor 4 and the inductor 9, the electric current $i_{ACDC}(t)$ is divided into a direct-current component $I_{DC}$ (DC component) which flows via the DC path 2 formed by the inductor 9, and into alternating-current components $i_{AC}(t)$ (AC components) which flow via the AC path 3. Thus, this arrangement made up of a capacitor 4 and an inductor 9, taking into consideration the primary winding 5' of the transformer 6 if necessary, constitutes a high-pass filter 15, wherein it is not ruled out that alternating-current components of the current $i_{ACDC}(t)$ also flow via the inductor 9.

A transfer function of this high-pass filter 15 has a linearly increasing profile in a frequency range below a cutoff frequency, wherein the cutoff frequency is determined from the size of the capacitor 4, the inductor 9, and the transformer 6. Depending on the size of the termination resistor 10, a resonance step-up occurring in the range of the cutoff frequency in the profile of the transfer function of the high-pass filter 15 may be attenuated by possibly dispensing with the termination resistor 10, so that the transfer function of the high-pass filter 15 increases monotonically at least up to the cutoff frequency. The transfer function of the high-pass filter 15 is constant above the cutoff frequency. In addition, an additional resonance maximum may be generated below the cutoff frequency via a suitable increase in the resistance value of the termination resistor 10, so that narrowband AC components, for example, communication signals, are transferred particularly efficiently at the resonance frequency of this resonance maximum.

The AC components $i_{AC}(t)$ which flow along the AC path are transformed by the transformer 6 to its secondary winding 5". Here, a measurement of the voltage induced in the secondary winding 5" could in principle already take place, for example, across the termination resistor 10 with the aid of a voltage measuring device 7, for example, with the aid of a voltmeter or an analog-digital converter, in order to determine the AC components $i_{AC}(t)$; however, the ratio of the amplitude of each AC component $i_{AC}(t)$ in the electric current $i_{ACDC}(t)$ at a given frequency to the amplitude of the voltage induced in the secondary winding 5" depends significantly on the given frequency. In the arrangement depicted here, this characteristic, known as non-linearity of a transfer function, is particularly pronounced for the voltage induced in the secondary winding 5" if the frequency of an alternating-current component $i_{AC}(t)$ is below the cutoff frequency of the high-pass filter 15.

A low-pass filter circuit 8 is therefore arranged between the secondary winding 5" and the voltage measuring device 7. This low-pass filter circuit 8 is designed in such a way that its transfer function in a frequency range which is below the cutoff frequency of the high-pass filter 15 and which contains AC components $i_{AC}(t)$ whose detection is of interest (for example, arc signals or powerline communication signals), is precisely complementary to the transfer function of the high-pass filter 15. Here, complementary means that the transfer function of the low-pass filter circuit 8 in said frequency range has a slope whose magnitude is equal to that of the transfer function of the high-pass filter, wherein, however, the particular slopes have opposite signs. As a result, the overall transfer function of the device according to FIG. 1, being combination of the two aforementioned transfer functions in a broad frequency range below the cutoff frequency of the high-pass filter 15, is constant or approximately constant.

Specifically, this means that the overall transfer function has a variation, i.e., a residual slope or a fluctuation range, which is significantly reduced with respect to the variation of the transfer function of the high-pass filter 15, which essentially corresponds to its slope and, for example, is 40 dB/decade; in particular, it has no monotonic increase and, for example, only corresponds to a fluctuation in the range of a few dB/decade. Therefore, a linear mapping of the AC components flowing on the input side of the device in the direct-current circuit 1 to the AC voltages measured on the output side is achieved in this frequency range, which comprises AC components to be detected, with the aid of the voltage measuring device 7. The AC voltages measured by the voltage measuring device 7 are fed to an evaluation device 11 which evaluates the measured AC voltages.

As a result of the use of the low-pass filter circuit 8, the inductor 9 and the capacitor 4 may thus be designed for a much higher frequency range than that of the AC components to be detected, so that significantly smaller components may be used in particular for the inductor 9. If, for example, an AC component $i_{AC}(t)$ in a frequency range of 10 kHz to 100 kHz is to be measured by the voltage measuring device 7 with a constant transfer function, in the case of dispensing with the compensation for the nonlinear profile of the transfer function below the cutoff frequency of the high-pass filter 15 achievable via the low-pass filter circuit 8, and in the case of a provided capacitor 4 with a capacitance of 10 µF, an inductor 9 with an inductance of approximately 25 µH is necessary in order to set a cutoff frequency of approximately 10 kHz. However, with the use of the low-pass filter circuit 8, the cutoff frequency may be significantly increased, for example, by a factor of 10 to approximately 100 kHz, so that only approximately 250 nH are necessary for the inductor 9 if the capacitance C_AC remains constant. The result is an overall drop in costs, losses, and sizes of the required components.

Figure 2:
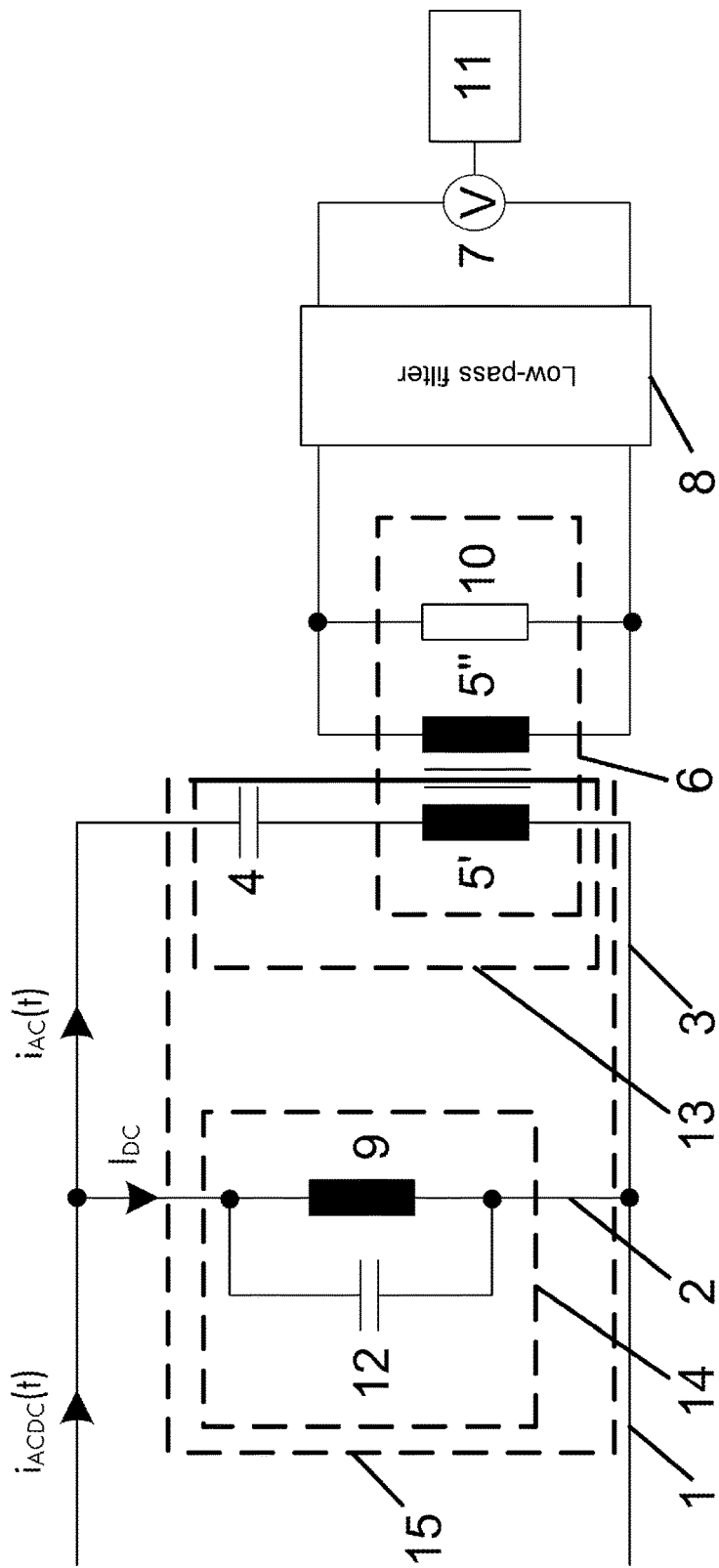
FIG. 2 shows another embodiment of a device according to the disclosure.

FIG. 2 shows a further embodiment in which a capacitor 12 is arranged electrically in parallel with the inductor 9 in the DC path 2. The parallel circuit made up of the inductor 9 and the capacitor 12 constitutes a band-stop filter 14 situated in the DC path 2, which is characterized by a frequency-dependent impedance having a maximum impedance at a resonance frequency. As a result, the slope in the transfer function of the high-pass filter 15, which is now formed from the band-stop filter 14 and the capacitor 4 and the bandpass filter 13, is further increased. It is also possible to compensate for this increased slope below the resonance frequency of the band-stop filter 14 via the low-pass filter circuit 8 on the secondary side of the transformer 6. A bandpass behavior in the frequency range of the resonance frequency of the band-stop filter in the DC path 2 may thus be achieved at the voltage measurement 7, wherein an overall transfer function of the device may have a largely constant profile with the aid of the suitably configured low-pass filter circuit 8, in particular below the resonance frequency of the band-stop filter 14. In one embodiment, the resonance frequency of the bandpass filter 13 in the AC path 3, which is formed via the series circuit made up of the capacitor 4 and the primary winding 5' of the transformer 6 with suitable sizing of the termination resistor 10, is also designed identically to the resonance frequency of the band-stop filter in the DC path.

Figure 3:
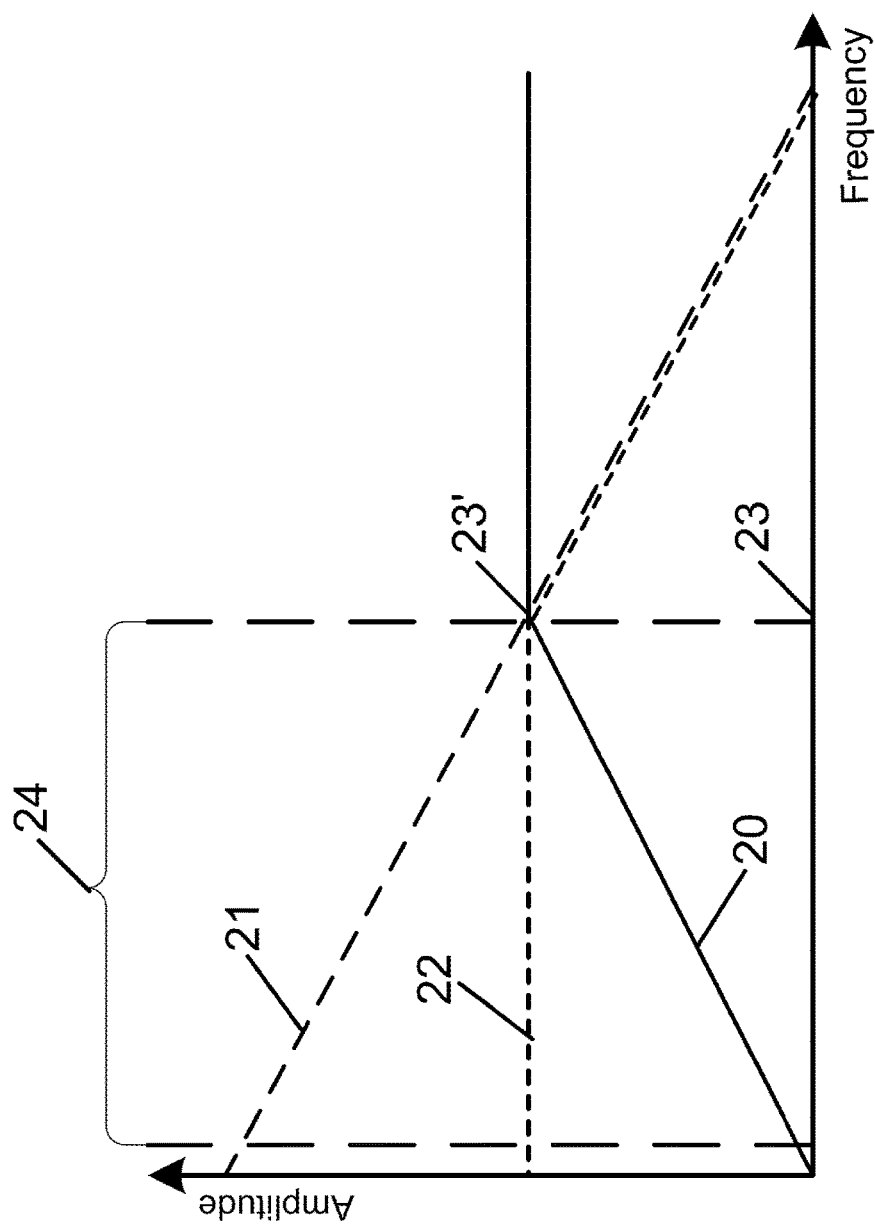
FIG. 3 shows transfer functions of the device according to the disclosure in a schematic representation.

FIG. 3 shows, by way of example for a device according to FIG. 1, the transfer function 20 of the high-pass filter 15 made up of a capacitor 4 and an inductor 9, the transfer function 21 of the low-pass filter circuit 8, and the resulting overall transfer function 22 of the device. The transfer function 20 of the high-pass filter 15 made up of a capacitor 4 and an inductor 9 has a cutoff frequency 23 which coincides with the transition from a linear slope to a constant profile of the transfer function 20 at the cutoff point 23', wherein, due to the suitable choice of the termination resistor 10, the resonance step-up occurring at the cutoff frequency 23 when using a transformer 6 without a termination resistor is attenuated in such a way that a monotonically increasing transfer function 20 results. In this embodiment, the cutoff frequency 23 was chosen for the upper end of the frequency range 24 of the AC components to be detected. The frequency range 24 of the AC components to be detected thus lies in the low-frequency stopband of the transfer function 20, in which an attenuation of the AC components takes place via the high-pass filter 15 made up of a capacitor 4 and an inductor 9.

The low-pass filter circuit 8 downstream from the transformer on the secondary side has a transfer function 21 which is exactly opposite, i.e. complementary to the transfer function 20 of the high-pass filter 15 made up of a capacitor 4 and an inductor 9, in particular at frequencies below the cutoff frequency 23, in that it has a profile having an identical slope, but a reversed sign of the slope. An overall transfer function 22 thereby results which has an ideal constant profile in terms of measurement in the frequency range 24 of the AC components $i_{AC}(t)$ to be detected, so that the voltage measuring device 7 arranged at the output of the low-pass filter circuit 8 provides an output signal which corresponds to the AC components to be detected in that it is proportional and linear with respect to them. In reality, unlike the transfer function 20 which is not compensated for via the low-pass filter circuit 8, the overall transfer function 22 in particular no longer has a monotonic slope, and its variation is only a few dB/decade, i.e., it is therefore smaller than the variation of the transfer function 20 by at least a factor of 5.

Specifically, the slope of the transfer function 20 of the high-pass filter 15 depicted in FIG. 2 made up of a band-stop filter 14 and a bandpass filter 13 is +40 dB/decade in the frequency range 24 of the AC components to be measured. In order to achieve a linearization of the overall transfer function 22, the low-pass filter circuit 8 must have a correspondingly opposite transfer function 21 having a slope of −40 dB/decade. This may, for example, be achieved via a passive second-order low-pass filter.

In addition to the nonlinearity of the transfer function 20 of the high-pass filter 15 in the frequency range 24 of the AC components $i_{AC}(t)$ to be measured, in order to compensate for the attenuation of these AC components $i_{AC}(t)$, the low-pass filter circuit 8 may also be designed as an active low-pass filter circuit, in particular as a second-order integrator made up of a series connection of two active inverting or non-inverting integrator circuits including operational amplifiers, each having an amplification of 20 dB/decade.

Figure 4:
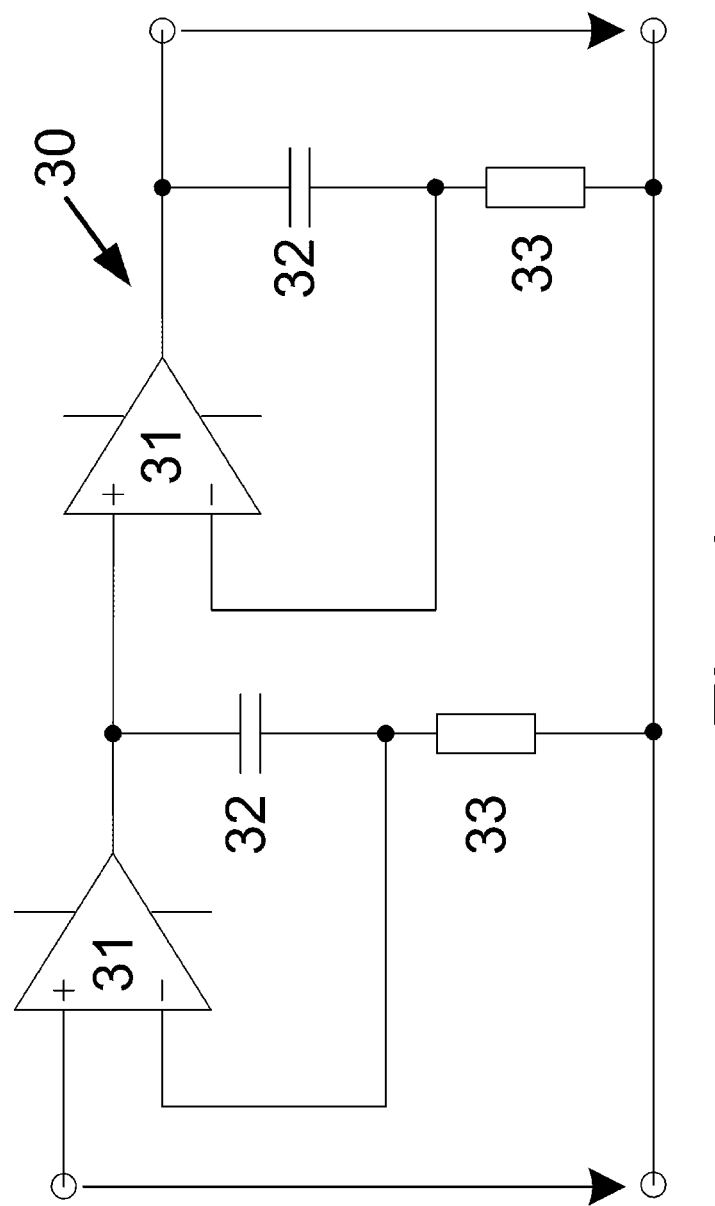
FIG. 4 shows an embodiment of a low-pass filter circuit as an integral part of a device according to the disclosure.

FIG. 4 shows, by way of example, a low-pass filter circuit 8 in the form of an active non-inverting second-order integrator circuit 30 comprising two operational amplifiers 31. Due to the capacitors 32 associated with the operational amplifiers, this integrator circuit 30 has a frequency-dependent amplification and constitutes an active low-pass filter whose characteristics may also be optimized based on the resistors 33.

If such an active non-inverting integrator circuit 30 is used, the overall transfer function 22 may also be linearized for frequencies above the cutoff frequency 23, in that an integration time constant of the non-inverting integrator circuit 30 is matched to the transfer function 20 of the high-pass filter 15 in such a way that the amplification of the non-inverting integrator circuit 30 assumes the value 1 above the cutoff frequency 23 of the high-pass filter 15. A constant profile of the overall transfer function 22 thus results at the output of the low-pass filter 8 even beyond the cutoff frequency 23, and the frequency range 24 of the AC components $i_{AC}(t)$ to be measured may be extended to frequencies above the cutoff frequency. Depending on the configuration of the components of the high-pass filter 15, in particular on the size of the termination resistor 10 and on whether the DC path comprises the inductor 9 or the band-stop filter 14, the profile of the overall transfer function 22 in the range of the cutoff frequency 23 may also have a monotonic profile or an resonance step-up.

Figure 5:
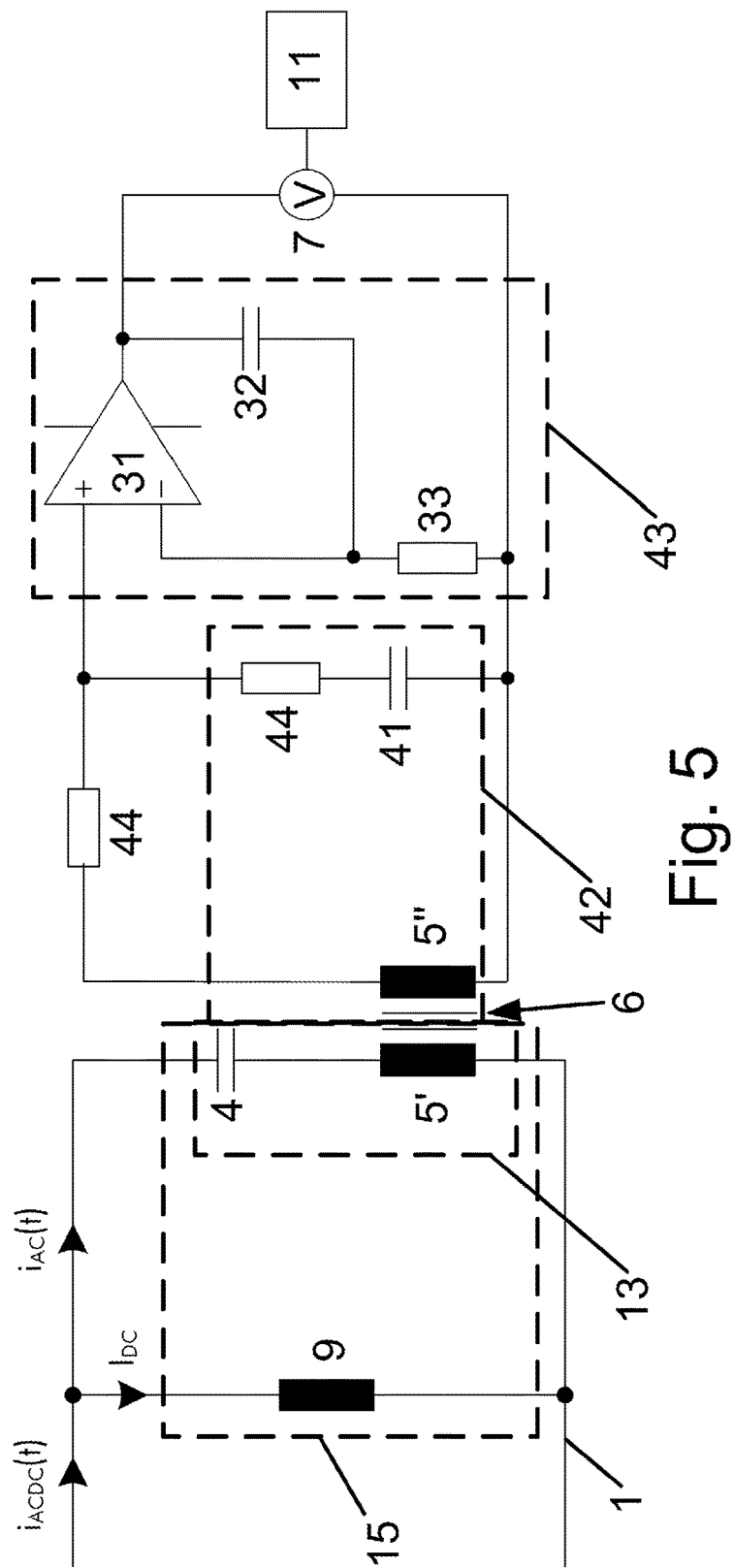
FIG. 5 shows another embodiment of a device according to the disclosure.

FIG. 5 shows an alternative embodiment of the device, in which an inductor 9 is arranged in the DC path 2 of the direct-current circuit 1, and a capacitor 41 is arranged in parallel with the secondary winding 5" of the transformer 6, which, together with the leakage inductance of the secondary winding 5" of the transformer 6, forms a resonant circuit 42. The components of this resonant circuit 42 may be sized in such a way that the resonant circuit 42 forms a point of resonance below the cutoff frequency 23 and within the frequency range 24. In one embodiment the resonance frequency of the resonant circuit 42 corresponds to the lower limit of the predefined frequency range 24. The slope of the transfer function 20 of the high-pass filter 15 in the frequency range 24 of the AC components to be measured is reduced to 20 dB/decade via this resonant circuit 42. This slope reduced in such a way may be compensated for via a first-order low-pass filter 8, for example, via the first-order integrator circuit 43 depicted in FIG. 5 made up of an operational amplifier 31 and a capacitor 32, having an amplification of 20 dB/decade in the frequency range 24 of the AC components to be measured. On the basis of the optional resistors 44, the attenuation in the range of the resonance frequency 23 of the resonant circuit 42 may be further optimized, in order to achieve a linear overall transfer function 22 of the device in an extended frequency range with the aid of the combination made up of an inductor 9, a bandpass filter 13, a resonant circuit 42, and an integrator circuit 43. Specifically, for example, the profile of the overall transfer function 22 in the range of the cutoff frequency 23 may be optimized to the specific application case via a suitable choice of the components and/or via addition of a resistor in series with the primary winding 5' of the transformer 6, and, for example, may be linearized, so that the frequency range of the AC components $i_{AC}(t)$ to be detected may be extended beyond the cutoff frequency 23.

We claim:

1. A device for detecting alternating-current components $i_{AC}$ of an electric current $i_{ACDC}$ flowing in a direct-current circuit, comprising:
   an inductor arranged in the direct-current circuit;
   an AC path arranged electrically in parallel with the inductor, wherein the AC path comprises a series circuit made up of a capacitor and a primary winding of a transformer; and
   a voltage measuring device,
   wherein a secondary winding of the transformer is connected to the voltage measuring device via a low-pass filter circuit, and
   wherein the low-pass filter circuit is configured to exhibit a transfer function in a predefined frequency range that has a profile which is complementary to a profile of a transfer function of a high-pass filter comprising the inductor and the capacitor in the predefined frequency range, so that the profile of an overall transfer function of the device in the predefined frequency range has a variation which is reduced at least by a factor of 5 with respect to the transfer function of the high-pass filter.

2. The device as claimed in claim 1, wherein a cutoff frequency of the high-pass filter made up of an inductor or a band-stop filter and a capacitor, respectively, lies above the predefined frequency range, wherein at least a factor of 5 lies between the cutoff frequency and a lower limit of the predefined frequency range.

3. The device as claimed in claim 1, wherein the low-pass filter circuit is an active low-pass filter.

4. The device as claimed in claim 3, wherein the low-pass filter circuit is an integrator circuit and comprises an operational amplifier.

5. The device as claimed in claim 2, further comprising a capacitor arranged in parallel with the secondary winding of the transformer, which, together with a leakage inductance of the secondary winding of the transformer, forms a resonant circuit, wherein a resonance frequency of the resonant circuit lies between the cutoff frequency of the high-pass filter and the lower limit of the predefined frequency range.

6. The device as claimed in claim 3, wherein the low-pass filter circuit is a second-order integrator circuit and comprises a series connection of operational amplifiers.

7. The use of the device as claimed in claim 1 in a direct-current circuit of a photovoltaic system.

8. A device for detecting alternating-current components $i_{AC}$ of an electric current $i_{ACDC}$ flowing in a direct-current circuit, comprising:
   an inductor arranged in the direct-current circuit;
   an AC path arranged electrically in parallel with the inductor, wherein the AC path comprises a series circuit made up of a capacitor and a primary winding of a transformer;
   a voltage measuring device,
   wherein a secondary winding of the transformer is connected to the voltage measuring device via a low-pass filter circuit, and
   an evaluation device configured to evaluate the alternating-current components $i_{AC}$ which are detected with the aid of the voltage measuring device, in a first predefined frequency range for the detection of arcs in the direct-current circuit, and in a second frequency range, which is different from the first frequency range, for the reception of powerline communication signals.

9. The device as claimed in claim 8, wherein a center frequency of the powerline communication signals is above the first predefined frequency range, and wherein the center frequency of the powerline communication signals corresponds to a resonance frequency of the bandpass filter and/or the band-stop filter.

10. The use of the device as claimed in claim 8 in a direct-current circuit of a photovoltaic system.

11. The device as claimed in claim 8, further comprising another capacitor arranged electrically in parallel with the inductor, so that the parallel circuit made up of the inductor and the another capacitor forms a band-stop filter.

12. The device as claimed in claim 8, wherein the transformer comprises a termination resistor arranged electrically in parallel with the secondary winding.

* * * * *